(12) United States Patent
Pagano

(10) Patent No.: US 9,712,041 B2
(45) Date of Patent: Jul. 18, 2017

(54) APPARATUSES AND METHODS FOR OVER-CURRENT PROTECTION OF DC-DC VOLTAGE CONVERTERS

(71) Applicant: Integrated Device Technology, Inc., San Jose, CA (US)

(72) Inventor: Rosario Pagano, Chandler, AZ (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 269 days.

(21) Appl. No.: 14/109,743

(22) Filed: Dec. 17, 2013

(65) Prior Publication Data

US 2015/0171737 A1 Jun. 18, 2015

(51) Int. Cl.
*H02M 1/32* (2007.01)
*G01R 19/04* (2006.01)
(Continued)

(52) U.S. Cl.
CPC .......... *H02M 1/32* (2013.01); *G01R 19/0092* (2013.01); *G01R 19/04* (2013.01); *H02H 7/1213* (2013.01);
(Continued)

(58) Field of Classification Search
CPC .......... H02H 9/02; H02H 9/025; G05F 1/573; G01R 19/0092; G01R 19/04; H02M 1/32;
(Continued)

(56) References Cited

U.S. PATENT DOCUMENTS 6,087,782 A 7/2000 Majid et al.
6,970,339 B2 11/2005 Wong et al.
(Continued)

FOREIGN PATENT DOCUMENTS

WO 02084852 10/2002
WO 03023947 3/2003

OTHER PUBLICATIONS

International Search Report for PCT Application No. PCT/US2014/070965 issued by the Korean Intellectual Property Office on Mar. 30, 2015, Corresponding Ref. No. 70107.00469WO01, pp. 1-3.

(Continued)

*Primary Examiner* — Gustavo Rosario Benitez
(74) *Attorney, Agent, or Firm* — Hayes and Boone LLP

(57) ABSTRACT

A peak current protection circuit includes a current sensing circuit configured to sense an operating current of a DC-DC converter, and an over-current detector operably coupled with the current sensing circuit. The over-current detector is configured to generate an over-current detect signal at a peak current limit that is that is independent of a voltage level of an output signal of the DC-DC converter. A method for providing over-current protection for a DC-DC converter includes sensing an operating current of a DC-DC converter at a first input of a comparator, sensing a reference current at a second input of the comparator, comparing the first input with the second input, and generating an over-current detect signal in response to the comparison such that a peak current limit for the DC-DC converter is independent of a voltage level of an output signal of the DC-DC converter.

19 Claims, 4 Drawing Sheets

(51) Int. Cl.
*G01R 19/00* (2006.01)
*H02H 7/12* (2006.01)
*H02M 3/158* (2006.01)
*H02M 1/00* (2006.01)

(52) U.S. Cl.
CPC .... *H02M 3/158* (2013.01); *H02M 2001/0009* (2013.01)

(58) Field of Classification Search
CPC ......... H02M 3/158; H02M 2001/0009; H02M 3/156
See application file for complete search history.

(56) References Cited

U.S. PATENT DOCUMENTS

| | | | | |
|---|---|---|---|---|
| 8,018,694 B1* | 9/2011 | Wu | ............................ | H02M 1/32 361/18 |
| 2004/0263139 A1* | 12/2004 | Goto | ........................ | H02M 1/32 323/282 |
| 2005/0036245 A1 | 2/2005 | Greenfeld | | |
| 2006/0145675 A1* | 7/2006 | Lee | ......................... | H02M 3/156 323/282 |
| 2010/0117618 A1 | 5/2010 | Cheng et al. | | |
| 2011/0031934 A1* | 2/2011 | Pagano | .................. | H02M 3/156 320/145 |
| 2011/0063760 A1 | 3/2011 | Coley et al. | | |
| 2011/0080150 A1 | 4/2011 | Wang et al. | | |
| 2011/0199145 A1* | 8/2011 | Kawai | .................... | H02M 3/156 327/419 |
| 2011/0211282 A1* | 9/2011 | Nanov | ..................... | H02M 1/32 361/18 |
| 2012/0039007 A1* | 2/2012 | Turchi | ................. | H02M 3/1584 361/87 |
| 2013/0135775 A1* | 5/2013 | Yao | ......................... | H02H 9/025 361/18 |
| 2013/0314067 A1 | 11/2013 | Matzberger et al. | | |
| 2014/0125303 A1* | 5/2014 | Dagan | .................... | H02M 3/156 323/282 |
| 2014/0210441 A1* | 7/2014 | Mao | ....................... | H02M 3/156 323/282 |
| 2014/0253079 A1* | 9/2014 | Ding | ..................... | H02M 3/156 323/283 |
| 2014/0253083 A1* | 9/2014 | Shao | ........................ | H02M 1/32 323/285 |
| 2015/0022923 A1* | 1/2015 | Chevrier | ................. | G01F 1/667 361/57 |

OTHER PUBLICATIONS

Written Opinion for PCT Application No. PCT/US2014/070965 issued by the Korean Intellectual Property Office on Mar. 30, 2015, Corresponding Ref. No. 70107.00469WO01, pp. 1-7.

* cited by examiner

APPARATUSES AND METHODS FOR OVER-CURRENT PROTECTION OF DC-DC VOLTAGE CONVERTERS

FIELD

Embodiments of the present disclosure relate generally to DC-DC converters and, more particularly, to apparatuses and methods related to over-current protection for DC-DC converters.

BACKGROUND

Over-current protection circuits for DC-DC power converters provide the desirable function of protecting the DC-DC power converter from internal or external component failure, and to prevent excessive heating in those failed components. Advantages of these circuits include increased functionality and efficiency in protecting the components. As an example, conventional over-current protection circuits may sense current from a DC-DC converter against a reference current. If the sensed current exceeds the reference current, the over-current protection circuit may limit the current of the DC-DC converter. Conventional over-current current protection circuits for DC-DC converters, however, often cause the DC-DC converter to suffer from instability (e.g., through sub-harmonic oscillations)—particularly at duty cycles higher than 50% during the peak current protection mode.

BRIEF SUMMARY

Embodiments of the present disclosure include an apparatus comprising a peak current protection circuit. The peak current protection circuit includes a current sensing circuit configured to sense an operating current of a DC-DC converter, and an over-current detector operably coupled with the current sensing circuit. The over-current detector is configured to generate an over-current detect signal at a peak current limit that is that is independent of a voltage level of an output signal of the DC-DC converter.

Another embodiment of the present disclosure includes an apparatus comprising an over-current detector. The over-current detector is configured to generate an over-current detect signal at a peak current limit that is independent of an operating point of an output signal of a DC-DC converter responsive to sensing an operating current of the DC-DC converter.

Another embodiment of the present disclosure includes a method for providing over-current protection for a DC-DC converter. The method comprises sensing an operating current of a DC-DC converter at a first input of a comparator, sensing a reference current at a second input of the comparator, comparing the first input with the second input, and generating an over-current detect signal in response to the comparison such that a peak current limit for the DC-DC converter is independent of a voltage level of an output signal of the DC-DC converter.

DETAILED DESCRIPTION

Figure 1:
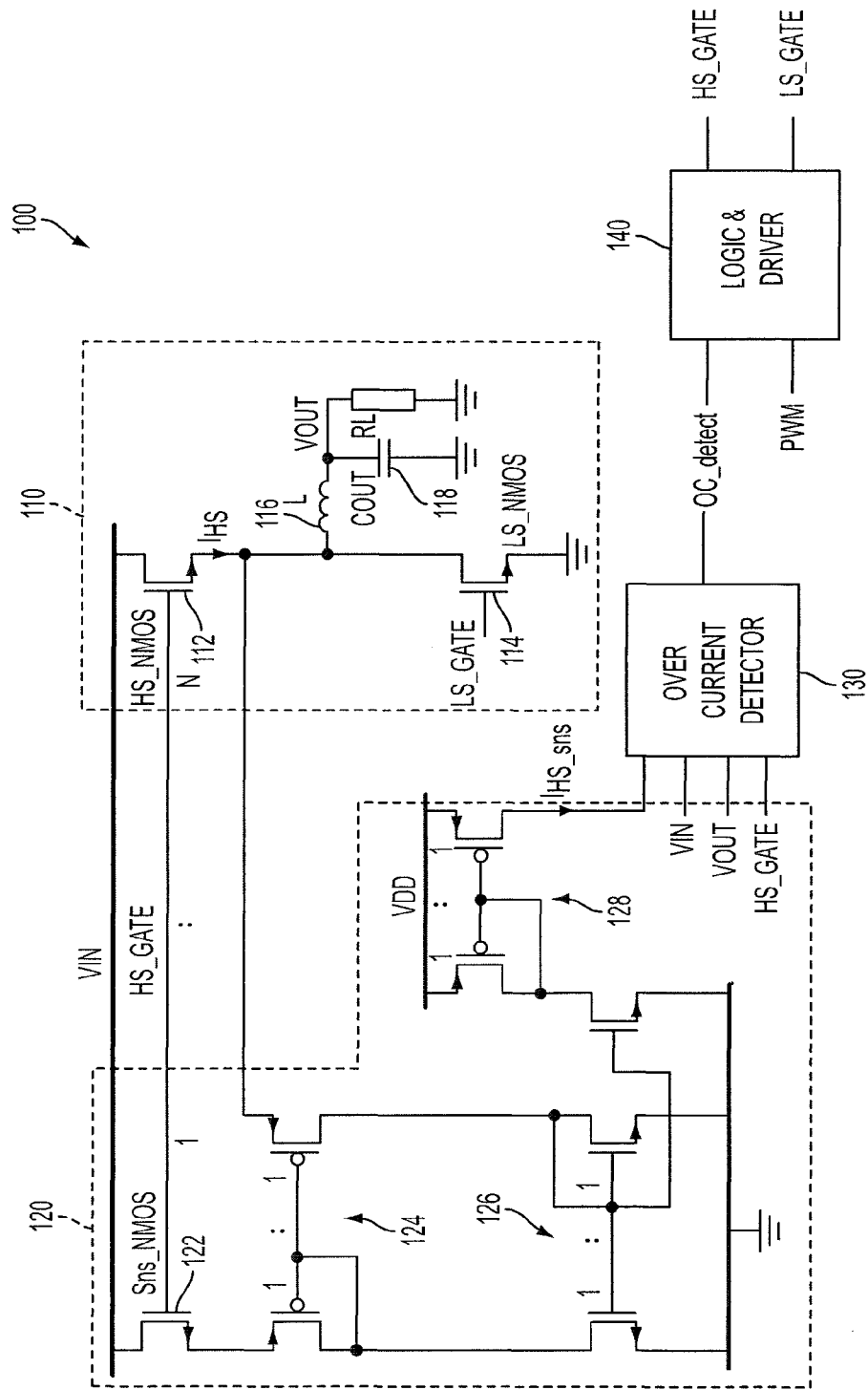
FIG. 1 is a schematic diagram of a voltage converter having a peak current protection circuit according to an embodiment of the present disclosure.

In the following description, reference is made to the accompanying drawings in which is shown, by way of illustration, specific embodiments of the present disclosure. Other embodiments may be utilized and changes may be made without departing from the scope of the disclosure. The following detailed description is not to be taken in a limiting sense, and the scope of the present invention is defined only by the appended claims.

Furthermore, specific implementations shown and described are only examples and should not be construed as the only way to implement or partition the present disclosure into functional elements unless specified otherwise herein. It will be readily apparent to one of ordinary skill in the art that the various embodiments of the present disclosure may be practiced by numerous other partitioning solutions.

In the following description, elements, circuits, and functions may be shown in block diagram form in order not to obscure the present disclosure in unnecessary detail. Additionally, block definitions and partitioning of logic between various blocks is exemplary of a specific implementation. It will be readily apparent to one of ordinary skill in the art that the present disclosure may be practiced by numerous other partitioning solutions. Those of ordinary skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general-purpose processor, a special-purpose processor, a Digital Signal Processor (DSP), an Application-Specific Integrated Circuit (ASIC), a Field-Programmable Gate Array (FPGA) or other programmable logic device, a controller, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A general-purpose processor may be considered a special-purpose processor while the general-purpose processor executes instructions (e.g., software code) stored on a computer-readable medium. A processor may also be implemented as a combination of computing devices, such as a combination of a DSP and a microprocessor, a plurality of microprocessors, one or more microprocessors in conjunction with a DSP core, or any other such configuration.

Also, it is noted that the embodiments may be described in terms of a process that may be depicted as a flowchart, a flow diagram, a structure diagram, or a block diagram. Although a process may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on computer readable media. Computer-readable media includes both non-transitory computer storage media and communication media, including any medium that facilitates transfer of a computer program from one place to another.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed or that the first element must precede the second element in some manner. In addition, unless stated otherwise, a set of elements may comprise one or more elements.

FIG. 1 is a schematic diagram of a voltage converter 100 having a peak current protection circuit 105 according to an embodiment of the present disclosure. The voltage converter 100 includes a DC-DC converter 110 operably couple with the peak current protection circuit 105. The peak current protection circuit 105 may include a current sensing circuit 120, an over-current detector 130, and control logic and driver 140. The over-current detector 130 is operably coupled with the current sensing circuit 120, the control logic and driver 140, as well as with the DC-DC converter 110. The DC-DC converter 110 may also be operably coupled with the control logic and driver 140.

The DC-DC converter 110 may be configured to receive an input signal VIN and generate an output signal VOUT. As a DC-DC converter, both the input signal VIN and the output signal VOUT are DC signals. The DC-DC converter 110 may be configured to generate an output voltage signal VOUT that has a different level than the input signal VIN. The different level may be a higher or a lower level depending on the configuration of the DC-DC converter 110. Therefore, the DC-DC converter 110 may be configured according to one of many different DC-DC converter topologies (e.g., buck, boost, buck-boost, etc.) depending on the desired application. In other words, the peak current protection circuit 105 may be applicable to any DC-DC converter 110; however, for ease of description the peak current protection circuit 105 will be described herein with reference to a buck converter topology because the DC-DC converter 110 shown in FIG. 1 includes a high side switch 112, a low side switch 114, an inductor 116, and a capacitor 118 operably coupled to each other in a buck converter configuration. The control logic and driver 140 may be configured to drive a high side gate signal HS_GATE and low side gate signal LS_GATE to control the operation of the high side switch 112, and low side switch 114, respectively. The output signal VOUT may be delivered to a load RL. The load RL may be a battery, circuitry, or other devices that may store and/or consume DC power. It is contemplated that the high side switch 112 and the low side switch 114 includes an appropriate transistor pair (e.g., combinations of NMOS and/or PMOS transistors).

The current sensing circuit 120 is configured to sense an operating current of the DC-DC converter 110. For purposes of discussion, the operating current will be described in terms of the high side current IHS flowing through the high side switch 112 when the high side switch 112 is enabled. Other operating currents may be sensed, such as the low side current flowing through the low side switch 114 when the low side switch is enabled.

The current sensing circuit 120 may sense the high side current IHS by generating a replica current IHS_sns through one or more current mirrors 124, 126, 128 coupled to the DC-DC converter 110. The one or more current mirrors 124, 126, 128 may be controlled to generate the replica current IHS_sns through a sense control switch 122 that is enabled by the high side gate signal HS_GATE. Thus, the high side switch 112 and the sense control switch 122 may share a common gate signal. The replica current IHS_sns may be a scaled replica of the high side current IHS. The replica current IHS_sns is scaled according to scaling factor "N," which is a ratio of the high side switch 112 of the DC-DC converter 110 and the sense control switch 122 of the current sensing circuit 120. In other words, IHS_sns=IHS/N. The scaling factor N may be any desirable value (e.g., 1000). If the low side current is sensed as the operating current, the sense control switch 122 may share a common gate signal (e.g., LS_GATE) such that the current sensing circuit 120 may generate a replica current of the low side current to pass to the over-current detector 130.

The over-current detector 130 is configured to generate an over-current detect signal OC_detect that indicates detection of an over-current condition for the DC-DC converter 110. Detection of an over-current situation may be based, at least in part, on sensing operating current (e.g., via the replica current IHS_sns), the input signal VIN, and the output signal VOUT. The over-current detector 130 will be described more fully with respect to FIGS. 2 through 5.

The control logic and driver 140 is configured to control the operation of the DC-DC converter 110 responsive to a PWM signal. The PWM signal may be generated by a PWM controller (not shown) that is configured to detect the output signal VOUT as a feedback signal, compare the output signal VOUT with a reference voltage (i.e., the desired voltage level for VOUT), and determine generate the appropriate PWM signal to control the operation of the control logic and driver 140 to generate the drive voltages (e.g., high side gate signal HS_GATE and low side gate signal LS_GATE).

The control logic and driver 140 may further be configured to control the operation of the DC-DC converter 110 responsive the over-current detect signal OC_detect. If the over-current detect signal OC_detect signal is asserted, the control logic and driver 140 may adjust (e.g., reduce) the duty cycle (D) of the DC-DC converter 110, which effectively limits the current (e.g., the high side current $I_{HS}$) of the DC-DC converter 110.

The duty cycle (D) contributes the voltage level of the output voltage signal VOUT relative to the input voltage signal VIN. For example, the relationship of the input voltage signal VIN and the output voltage signal VOUT relative to the duty cycle (D) may be:

$$D = \frac{VOUT}{VIN}. \qquad (1)$$

In addition, the stability of the voltage converter 100 may be improved by the over-current detector 130 sensing the input signal VIN and the replica current IHS_sns and generating a ramp voltage in response thereto. The ramp voltage may be compared with a reference voltage having a voltage level that depends on the sensed output signal VOUT and a reference current IREF. As a result of sensing the output signal VOUT to contribute to the reference voltage used in the over-current detector, the peak current limit may be independent of the actual voltage level of the output signal VOUT, and therefore also independent of the bias conditions of the switches 112, 114 of the DC-DC converter 110. As a result of sensing the input signal VIN to generate a compensation ramp voltage for the over-current detector 130, accuracy and stability of the peak current protection circuit 105 may be improved. Thus, the peak current protection circuit 105 may protect the DC-DC converter 110 by limiting its current independent of the actual level of the output signal VOUT, while at the same time ensuring that the DC-DC converter 110 is stable during current protection mode. As a result, the peak current protection circuit 105 may be configured to reduce (e.g., prevent) subharmonic oscillations that often occur in conventional DC-DC converters at duty cycles that are greater than 50%.

Figure 2:
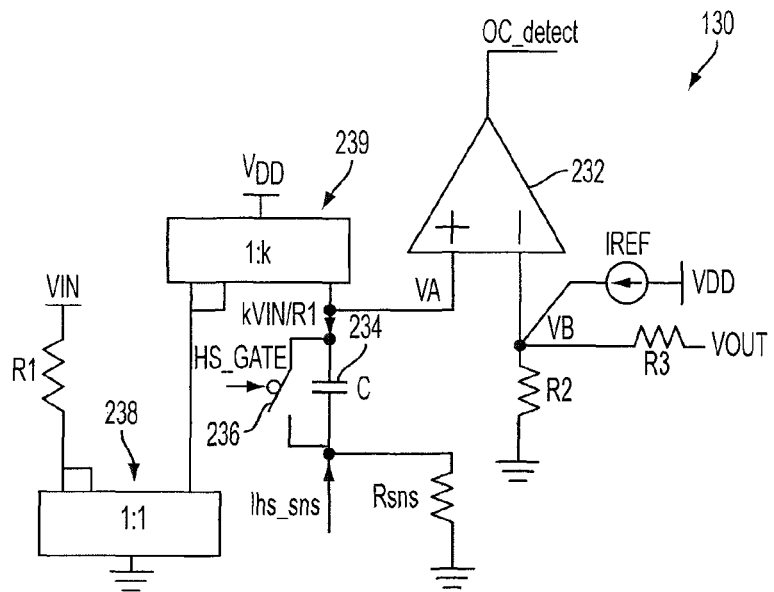
FIG. 2 is a schematic diagram of the over-current detector of FIG. 1.

FIG. 2 is a schematic diagram of the over-current detector 130 of FIG. 1. The over-current detector 130 may include a comparator 232 configured to compare a first voltage VA and a second voltage VB, and generate the over-current detect signal OC_detect in response thereto. The comparator 232 includes a first input (e.g., non-inverting) and a second input (e.g., inverting). The first input may be coupled to a capacitor 234 operably coupled in series with a sense resistor Rsns used to sense the replica current IHS_sns. The first input may further be coupled with the current mirrors 238, 239 such that the input signal VIN may be sensed by the over-current detector 130. The over-current detector 130 may further include a ramp generator that includes a switch 236 that is coupled parallel to the capacitor 234. The switch 236 may be controlled by the a gate signal (e.g., HS_GATE) such that the capacitor 234 may be charged and discharged during operation of the operation of the DC-DC converter 110. Thus, the first voltage VA is a ramp current that varies over time responsive to the input signal VIN and the replica current IHS_sns. In other words, the input signal VIN and the replica current IHS_sns are sensed by the over-current detector 130 to contribute to the generation of the over-current detect signal OC_detect.

The second input may be coupled to a constant reference current IREF. In addition, the second input may be coupled to a voltage divider (e.g., resistors R2, R3) to sense the output signal VOUT. As a result, the output signal VOUT also contributes to the second voltage VB on the second input of the over-current detector 130.

In operation, the first voltage VA and the second voltage VB are compared by the comparator 232. If the first voltage VA is greater than the second voltage VB, an over-current condition may be detected. As a result, the over current signal OC_detect may be asserted. If the over-current signal OC_detect is asserted, the control logic and driver 140 may adjust (e.g., reduce) the duty cycle of the high side gate signal HS_GATE and the low side gate signal LS_GATE.

The capacitor 234 and the switch 236 may form a ramp generator for the first voltage VA. In operation, if the switch 236 is enabled (e.g., by high side gate signal HS_GATE being asserted), the capacitor 234 charges with the current generated by the input signal VIN. This current that is primarily charging the capacitor 234 may be equal to kVIN/R1, wherein k is a scaling factor of the current mirror 239 and R1 is the resistor used sense the input signal VIN. If the switch 236 is disabled (e.g., by high side gate signal HS_GATE being deasserted), the capacitor 234 may be discharged (e.g., to 0V across the capacitor 234). Thus, the ramp generator associated with the first voltage VA may be active during the interval of the high side gate signal HS_GATE, and inactive during the remaining part of the duty cycle. As will be discussed below, the slope of the ramping of the first voltage VA may contribute to the stability of the system.

Figure 3:
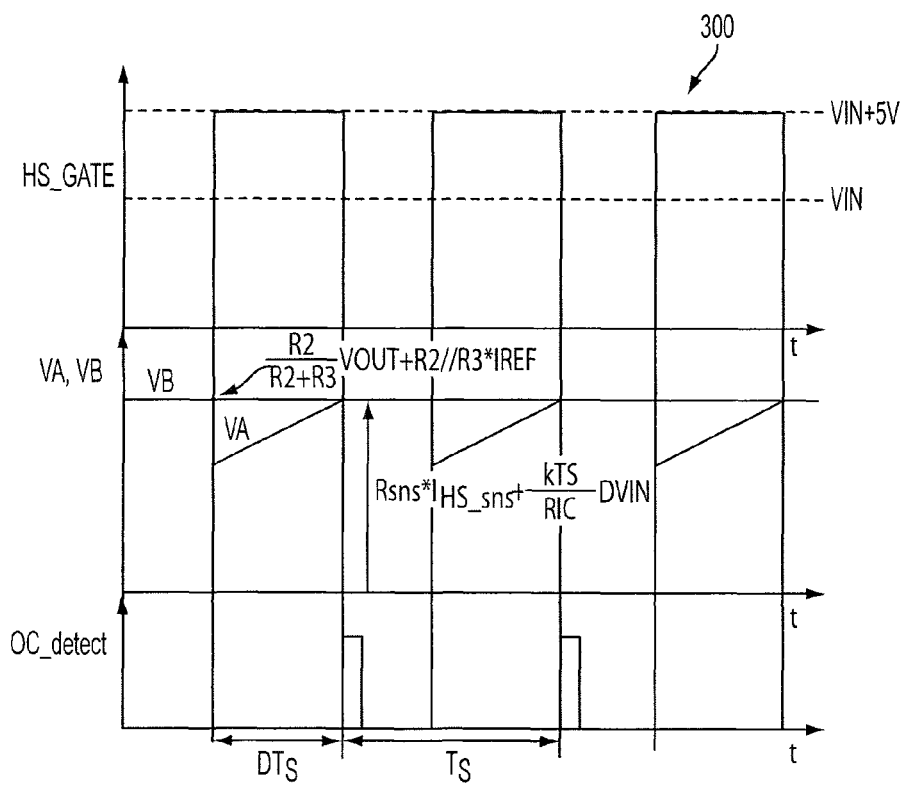
FIG. 3 is a waveform showing the over-current detect signal, the high side gate signal, the first voltage and second voltage that are inputs to the comparator.

FIG. 3 is a waveform 300 showing the high side gate signal HS_GATE, the first voltage VA and second voltage VB that are inputs to the comparator 232, and the over-current detect signal OC_detect.

The high side gate signal HS_GATE is asserted and deasserted to enable and disable the high side switch 112. As shown in FIG. 3, the high side gate signal HS_GATE may be asserted at a value (e.g., VIN+5V) sufficient to turn on the gate of the high side switch 112. Although the value shown in FIG. 3 states VIN+5V other values are contemplated depending on the turn on characteristics of the high side switch 112. Although the low side gate signal LS_GATE is not shown in FIG. 3, it should be recognized that it is asserted and deasserted in an complementary manner with respect to the high side gate signal HS_GATE such that the high side switch 112 and the low side switch 114 are not conducting at the same time.

The first voltage VA is a ramp voltage that is dependent on the input voltage VIN and the replica current IHS_sns. The first voltage VA may be generated by charging and discharging the capacitor 234 responsive to the high-side gate signal HS_GATE. The first voltage VA may be:

$$VA = Rsns * I_{HS\_sns} + \frac{kDTS}{R1C} VIN, \qquad (2)$$

wherein Rsns is the resistance of the sense resistor Rsns, IHS_sns is the replica of the high side switch current, k is the scaling factor of the current mirror 239, D is the duty cycle (D), TS is the period (TS) of the high side gate signal HS_GATE, R1 is the resistance of the resistor (R1) coupled to the input signal VIN sensed by the over-current detector 130, C is the capacitance of the capacitor 234 coupled to the non-inverting node of the comparator 232.

The inverting input of the comparator 232 may be coupled to a constant reference current IREF. The second voltage VB is constant voltage which is a function of output signal VOUT of the DC-DC converter 110. The second voltage VB may be:

$$VB = \frac{R2}{R2+R3} VOUT + R2 \mathbin{/\mkern-6mu/} R3 * IREF, \qquad (3)$$

wherein R2 and R3 are the resistances of the voltage divider coupled to sense the output signal VOUT, and IREF is the constant reference current. The second voltage VB may be have a substantially constant value that is used as a reference voltage in the over-current detector 130.

If equation (1) is used to substitute for the duty cycle (D), the first voltage VA may be expressed as:

$$VA = Rsns * I_{HS\_sns} + \frac{kTS}{R1C} VOUT. \quad (4)$$

The first voltage VA and the second voltage VB are the inputs to the comparator 232. Therefore, if the first voltage VA and the second voltage VB are equal, the peak current of the replica current IHS_sns may be determined before an over-current condition is present on the high side switch 112. If the first voltage VA and the second voltage VB are set to be equal to each other, the following equality results:

$$\frac{R2}{R2+R3} VOUT + R2 // R3 * IREF = Rsns * I_{HS\_sns} + \frac{kTS}{R1C} VOUT. \quad (5)$$

To achieve a peak current protection circuit 105 that has a peak current limit that is independent of the voltage level of the output signal VOUT, a condition may be found such that the VOUT terms may be removed from equation (5). In other words, a condition may be satisfied whereby VOUT may be removed from equation (5). Such a condition may result when the coefficients of the VOUT terms are set to be equal. In other words, $$\frac{R2}{R2+R3} = \frac{kTS}{R1C}. \quad (6)$$

Therefore, the values of R2, R3, k, TS, R1, and C may be selected so that equation (6) is satisfied. If the components are selected so the at equation (6) is satisfied, equation (5) may be reduced to:

$$I_{HS\_sns} = \frac{I_{HS}}{N} = \frac{R2 // R3}{Rsns} * IREF. \quad (7)$$

By solving for IHS:

$$I_{HS} = N \frac{R2 // R3}{Rsns} * IREF. \quad (8)$$

As a result, because N, R2, R3, Rsns, and IREF are all constant values, the peak current protection circuit 105 protects IHS to a fixed constant value that is not dependent on the output signal VOUT.

Figure 4:
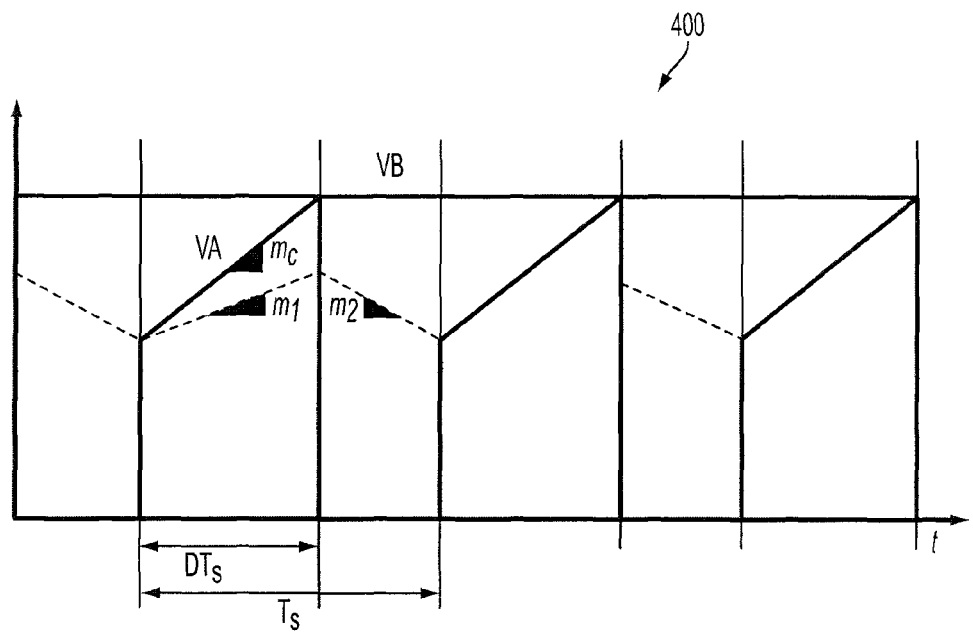
FIG. 4 is a waveform illustrating the first voltage and the second voltage input over time into the comparator of the over-current detector.

FIG. 4 is a waveform 400 illustrating the first voltage VA and the second voltage VB input into the comparator 232 (FIG. 2) over time. As shown in FIG. 4, mc is the slope of the first voltage VA with the capacitor 234 present in the over-current detector 130. Thus, the first voltage VA represents the compensating ramp voltage due to the charging of the capacitor 234. In addition, m1 is the slope of the first voltage VA without the capacitor 234 present in the over-current detector 130, and m2 is the slope of the inductor current of the inductor 116 of the DC-DC converter 110 during off time.

Even though the output signal VOUT may not determine the peak current value of IHS, the output signal VOUT may still contribute to overall stability of the voltage converter 100. According to the perturbation theory of DC-DC converters, stability occurs when:

$$m_c > 0.5 * |m2|; \quad (9)$$

$$m_C = k \frac{VIN}{R1C}; \text{ and} \quad (10)$$

$$m_2 = Rsns \frac{VOUT}{NL}. \quad (11)$$

By combining equations (9), (10), and (11), a capacitor value may be chosen to satisfy the following inequality:

$$C < \frac{2kLN}{R1Rsns} \frac{VIN}{VOUT}. \quad (12)$$

Therefore, for a selected R1, Rsns, k, L, N, VIN, and VOUT, the capacitor (C) value may be selected to satisfy equation (12) to identify a condition for stability of the voltage converter 100. Thus, by sensing the output signal VOUT in the over-current detector 130, the peak current protection circuit 105 may be configured such that the peak current limit of the DC-DC converter 110 may be independent of the actual voltage level (i.e., operating point) of the output signal VOUT, while determine a condition for stability of the voltage converter 100.

Figure 5:
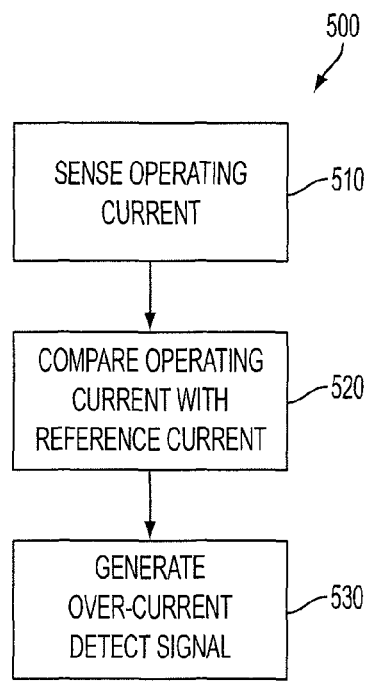
FIG. 5 is a flowchart illustrating a method for providing over-current protection for a DC-DC converter according to an embodiment of the present disclosure.

FIG. 5 is a flowchart 500 illustrating a method for providing over-current protection for a DC-DC converter according to an embodiment of the present disclosure. At operation 510, an operating current of the DC-DC converter may be sensed. Sensing the operating current may include sensing a replica current (e.g., a scaled replica current) of the operating current, the scaled replica current generated by a current sensing circuit coupled with the DC-DC converter. As an example, operating current may be the high side current flowing through the high-side switch of the DC-DC converter.

At operation 520, the operating current may be compared with a reference current. The comparing the operating current with the reference current may include comparing a first voltage and a second voltage on inputs to a comparator. The first voltage may be generated by sensing the operating current and the input signal of the DC-DC converter. Sensing the operating current may include sensing a scaled replica of the operating current. Sensing the operating current may further include causing the operating current to flow into the node coupled to the first input. Sensing the input signal may include causing a current dependent on the input signal to flow through a resistor coupled with the node coupled with the first input. The resistor may be coupled with the node through one or more current mirrors that may scale the current depended on the input signal. The first voltage may be further generated by switchably charging a capacitor coupled to the first input while the operating current is flowing, and switchably discharging the capacitor while the operating current is not flowing. The second voltage may be generated by sensing the reference current and the output signal of the DC-DC converter. Sensing the output signal may include causing a current dependent on the output signal to flow through a voltage divider coupled to the second input. Sensing the reference current may include causing the reference current to flow into the node coupled to the second input.

At operation 530, the over-current detector may generate an over-current detect signal responsive to an over-current condition being detected. The over-current condition may be set at a peak current limit that is independent of the operating point of the output signal. The over-current detect signal may be sent to control logic and driver for the DC-DC converter, which may adjust (e.g., reduce) the operating current (e.g., by reducing the duty cycle of the gate drive signals).

Figure 6:
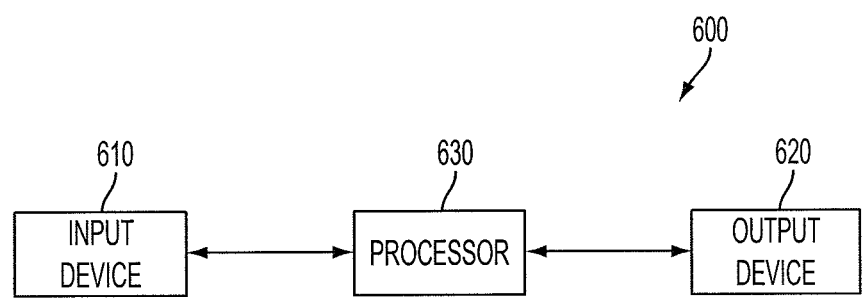
FIG. 6 is a simplified block diagram of an electronic system incorporating the voltage converter according to an embodiment of the present disclosure.

FIG. 6 is a simplified block diagram of an electronic system 600 incorporating the voltage converter according to an embodiment of the present disclosure. The electronic system 600 includes an input device 610, an output device 620, and a processor 630, at least one of which incorporates the voltage converter 100 having the peak current protection circuit 105 as previously discussed herein. The electronic system 600 may include any device and/or system that incorporates DC-DC converter to provide power to a load of the electronic system 600. For example, the electronic system 600 may include electronic devices such as cellular phones, smart phones, tablet computers, electronic readers, laptop computers, personal computers, televisions, and other systems and/or devices that may utilize DC-DC converters.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the disclosure. In addition, features from one embodiment may be combined with features of another embodiment while still being encompassed within the scope of the disclosure as contemplated by the inventor.

What is claimed is:

1. An apparatus, comprising:
a peak current protection circuit including:
   a current sensing circuit configured to sense an operating current of a DC-DC converter; and
   an over-current detector operably coupled with the current sensing circuit, the over-current detector comprising:
      a first circuit to generate a first voltage based on the sensed operating current and a voltage level of an input signal of the DC-DC converter (VIN);
      a second circuit to generate a second voltage based on a voltage level of an output signal from the DC-DC converter (VOUT) and a reference current (IREF); and
      a comparator having a first input for receiving the first voltage, a second input for receiving the second voltage, and an output for providing an over-current detect signal based on a comparison of the first voltage and the second voltage, the over-current detect signal indicating whether the sensed operating current exceeds a peak current level which is proportional to the IREF;
   wherein one or more parameters of the over-current detector are selected such that when the first voltage is equal to the second voltage a contribution of the VOUT to the first voltage is equal to a contribution of the VOUT to the second voltage so that the over-current detect signal is independent of the VOUT.

2. The apparatus of claim 1, wherein the current sensing circuit is configured to generate a replica current that is a scaled version of the operating current.

3. The apparatus of claim 2, wherein the operating current is at least one of a high side current flowing through a high side switch of the DC-DC converter, and a low side current flowing through a low side switch of the DC-DC converter.

4. The apparatus of claim 1, further comprising the DC-DC converter operably coupled with the peak current protection circuit to provide the over-current detector with the output signal.

5. The apparatus of claim 4, further comprising a control logic and driver operably coupled with the DC-DC converter and the over-current detector, and configured to generate gate signals to control the DC-DC converter responsive to the over-current detect signal.

6. The apparatus of claim 5, wherein the control logic and driver is configured to adjust a duty cycle of the gate signals in response to the over-current detect signal being asserted.

7. The apparatus of claim 4, wherein the DC-DC converter is selected from the group consisting of a boost converter, a buck converter, and a boost-buck converter.

8. An apparatus, comprising:
an over-current detector comprising:
   a first circuit to generate a first voltage based on a sensed operating current of a DC-DC converter and based on a voltage level of an input signal of the DC-DC converter (VIN);
   a second circuit to generate a second voltage based on a voltage level of an output signal from the DC-DC converter (VOUT) and a reference current (IREF);
   a comparator having a first input for receiving the first voltage, a second input for receiving the second voltage, and an output for providing an over-current detect signal based on a comparison of the first voltage and the second voltage, the over-current detect signal indicating whether the sensed operating current exceeds a peak current level which is proportional to the IREF, wherein one or more parameters of the over-current detector are selected such that when the first voltage is equal to the second voltage a contribution of the VOUT to the first voltage is equal to a contribution of the VOUT to the second voltage so that the over-current detect signal is independent of the VOUT.

9. The apparatus of claim 8, further comprising a ramp generator operably coupled to the first input of the comparator, wherein the ramp generator is configured to cause the first voltage to increase according to a slope while the sensed operating current is being sensed.

10. The apparatus of claim 9, wherein the ramp generator includes:
a capacitor coupled with the first input of the comparator; and
a switch coupled in parallel with the capacitor, wherein the switch is configured to cause the first voltage to charge the capacitor while the sensed operating current is being sensed.

11. The apparatus of claim 10, wherein a capacitance of the capacitor satisfies:

$$C < \frac{2kLN}{R1 Rsns} \frac{VIN}{VOUT}$$

wherein C is the capacitance of the capacitor, R1 is a resistance of a first resistor used to sense the VIN, k is a scaling factor of a current mirror used to sense the VIN, N is a scaling factor for the sensed operating current for a control switch used to generate a scaled replica of the sensed operating current, and Rsns is a resistance of a second resistor used to sense the scaled replica of the sensed operating current.

12. The apparatus of claim 8, wherein the peak current level at which point the over-current detect signal is generated is set at:

$$I_{HS} = N\frac{R2 // R3}{Rsns} * IREF$$

wherein $I_{HS}$ is the peak current level for the sensed operating current, N is a scaling factor for the sensed operating current for a current mirror used to generate a scaled replica of the sensed operating current, R2 is a resistance of a first resistor, R3 is a resistance of a second resistor, the first resistor and second resistor being resistors of a resistor divider used to sense the output signal, Rsns is a resistance of a sense resistor used to sense the scaled replica of the sensed operating current, and the IREF is the reference current.

13. A method for providing over-current protection for a DC-DC converter, the method comprising:
sensing, by a current sensing circuit, an operating current of the DC-DC converter;
sensing, by a first circuit of an over-current detector, a first voltage that depends on the sensed operating current and a voltage level of an input signal of the DC-DC converter (VIN);
sensing, by a second circuit of the over-current detector, a second voltage that depends on a voltage level of an output signal of the DC-DC converter (VOUT) and a reference current (IREF);
comparing the first voltage with the second voltage using a comparator; and
generating, by the comparator, an over-current detect signal in response to the comparison, the over-current detect signal indicating whether the sensed operating current exceeds a peak current level which is proportional to the IREF;
wherein one or more parameters of the over-current detector are selected such that when the first voltage is equal to the second voltage a contribution of the VOUT to the first voltage is equal to a contribution of the VOUT to the second voltage so that the over-current detect signal is independent of the VOUT.

14. The method of claim 13, further comprising
charging a capacitor coupled to the first voltage while the sensed operating current is being sensed; and
discharging the capacitor while the sensed operating current is not being sensed.

15. The method of claim 14, wherein charging and discharging the capacitor includes enabling and disabling a switch coupled in parallel with the capacitor, the switch being controlled by a gate drive signal for the DC-DC converter.

16. The method of claim 13, wherein sensing the operating current of the DC-DC converter includes sensing a scaled replica of the operating current of the DC-DC converter.

17. The apparatus of claim 8, further comprising a control logic and driver coupled to the over-current detector and the DC-DC converter, the control logic and driver being configured to adjust a duty cycle of gate signals responsive to the over-current detect signal.

18. The method of claim 13, further comprising adjusting a duty cycle of gate signals responsive to the over-current detect signal.

19. The method of claim 14, wherein the peak current level at which point the over-current detect signal is generated is set at:

$$I_{HS} = N\frac{R2 // R3}{Rsns} * IREF$$

wherein $I_{HS}$ is the peak current level for the sensed operating current, N is a scaling factor for the sensed operating current for a current mirror used to generate a scaled replica of the sensed operating current, R2 is a resistance of a first resistor, R3 is a resistance of a second resistor, the first resistor and second resistor being resistors of a resistor divider used to sense the output signal, Rsns is a resistance of a sense resistor used to sense the scaled replica of the sensed operating current, and the IREF is the reference current.

* * * * *